United States Patent [19]
Lee

[11] Patent Number: 5,974,093
[45] Date of Patent: Oct. 26, 1999

[54] DEVICE AND METHOD FOR AUTOMATICALLY CONTROLLING TRANSMISSION POWER

[75] Inventor: Sang-Keun Lee, Seoul, Rep. of Korea

[73] Assignee: SamSung Electronics Co., Ltd., Kyungki-do, Rep. of Korea

[21] Appl. No.: 08/777,762

[22] Filed: Dec. 30, 1996

[30] Foreign Application Priority Data

Dec. 30, 1995 [KR] Rep. of Korea ...................... 95-67876

[51] Int. Cl.⁶ .................................................. H04B 1/04
[52] U.S. Cl. ........................ 375/297; 375/307; 455/126; 455/127; 455/522
[58] Field of Search .................................. 375/200, 297, 375/224, 307; 370/311, 318, 320, 335, 342, 441, 479; 455/126, 127, 522, 561

[56] References Cited

U.S. PATENT DOCUMENTS

| | | | |
|---|---|---|---|
| 5,199,045 | 3/1993 | Kato | 375/200 |
| 5,323,329 | 6/1994 | Keane | 364/492 |
| 5,659,892 | 8/1997 | Soleimani et al. | 455/103 |
| 5,715,526 | 2/1998 | Weaver, Jr. et al. | 455/126 |

*Primary Examiner*—Young T. Tse
*Attorney, Agent, or Firm*—Robert E. Bushnell, Esq.

[57] ABSTRACT

A device and method for automatically controlling transmission power of a CDMA site, by automatically controlling high frequency power of the CDMA site. The circuit for automatically controlling transmission power of a site in a CDMA mobile communication system, including: at least, one digital processing unit for encoding data on a transmission channel; a transmitter for converting, filtering and amplifying a signal output from the digital processor; a power amplifier for amplifying transmission data to propagate the amplified data in the air; a variable attenuator interposed between the transmitter and the power amplifier, for varying data output from the transmitter to be transmitted to the power amplifier; a power measurer for measuring the transmission power from the power amplifier; a detector for comparing a calculated value of the transmission power with a measurement value of the transmission power to obtain an error power therefrom; a power controller for comparing an absolute value of the error power with a predetermined permissible variation, to control the variable attenuator in association with the comparison result; and a coupler for coupling the power amplifier to the power measurer.

20 Claims, 2 Drawing Sheets

6,974,093

DEVICE AND METHOD FOR AUTOMATICALLY CONTROLLING TRANSMISSION POWER

BACKGROUND OF THE INVENTION

1. Field of the Invention

The present invention relates to a code division multiple access (hereinafter, referred to as "CDMA") mobile communication system, and more particularly to a device and method for automatically, precisely controlling transmission power of a CDMA site.

2. Description of the Related Art

In a CDMA mobile communication system, communication capability for a frequency resource is determined by noise distributions between whole cells which use the same frequency band. Therefore, in order to optimize the communication capability for the whole cells, the high frequency output transmitted from the cells must be controlled appropriately. Thus, it is necessary to control the high frequency transmission power precisely; controlling the high frequency transmission power is, however, difficult due to the differences between the features of analog circuit and digital transmission circuit of a transmitter in a CDMA site.

A conventional CDMA mobile communication system has a transmission circuit consisting of inconsistent analog and high frequency circuits. Therefore, in the CDMA system which requires for a precise transmission power, the transmission power is controlled by measuring the transmission power and adjusting gains of variable circuits according thereto. To the end, variable gain sections of the circuit boards are precisely adjusted at the manufacturing process, or the high frequency circuit and analog circuit are manually adjusted upon measuring the whole transmission power when setting up the sites. Such conventional method requires expert technical knowledge and lot of time for controlling the transmission power precisely.

SUMMARY OF THE INVENTION

It is therefore an object of the present invention to provide a device and method for automatically controlling transmission power of a CDMA site, by automatically controlling high frequency power of the CDMA site.

According to an aspect of the present invention, a circuit for automatically controlling transmission power of a site in a CDMA mobile communication system, comprises: at least, one digital processing unit for encoding data on a transmission channel; a transmitter for converting, filtering and amplifying a signal output from the digital processor; a power amplifier for amplifying transmission data to propagate the amplified data in the air; a variable attenuator interposed between the transmitter and the power amplifier, for varying data output from the transmitter to be transmitted to the power amplifier; a power measurer for measuring the transmission power from the power amplifier; a detector for comparing a calculated value of the transmission power with a measurement value of the transmission power to obtain an error power therefrom; a power controller for comparing an absolute value of the error power with a predetermined permissible variation, to control the variable attenuator in association with the comparison result; and a coupler for coupling the power amplifier to the power measurer.

According to another aspect of the present invention, a method for automatically controlling transmission power of a site in a CDMA mobile communication system including high frequency power transmitter, a power amplifier, a power measurer, a detector, a power controller, a variable attenuator interposed between the high frequency power transmitter and the power amplifier, comprises the steps of: calculating a transmission power at a steady operation state by the detector to generate a calculated value of the steady-state transmission power; measuring the transmission power to generate a measurement value of the transmission power; detecting an error power by subtracting the calculated value from the measurement value; comparing an absolute value of the error power with a predetermined permissible variation; controlling the variable attenuator in association with the error power if the absolute value of the error power is higher than the permissible variation; and storing the error power if the absolute value of the error power is lower than the permissible variation, and controlling the variable attenuator in association with the stored error power.

BRIEF DESCRIPTION OF THE DRAWINGS

The above and other objects, features and advantages of the present invention will become more apparent in the light of the following detailed description of an exemplary embodiment thereof taken with the attached drawings in which.

DETAILED DESCRIPTION OF THE PREFERRED EMBODIMENT

Figure 1:
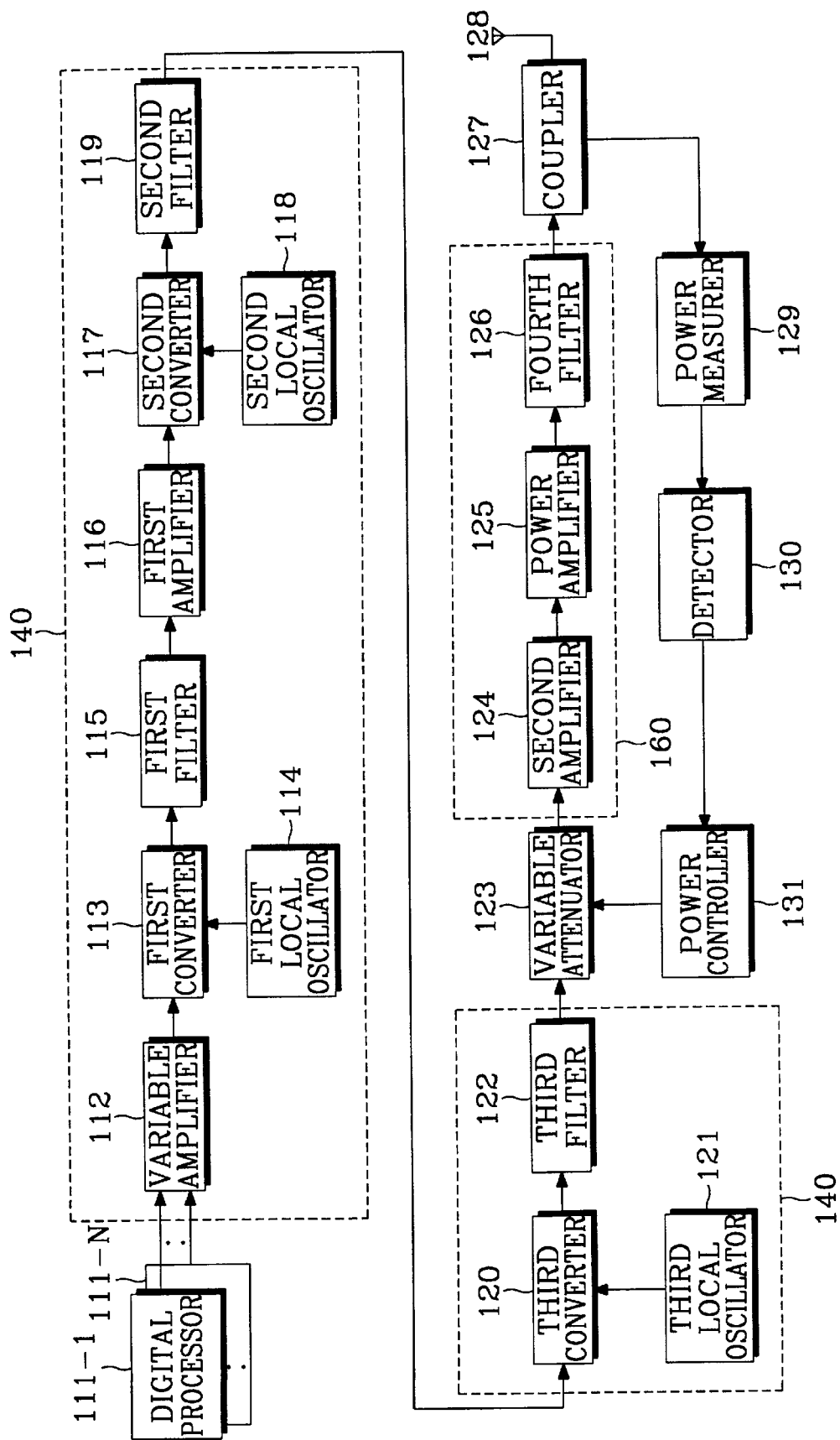
FIG. 1 is a block diagram of a circuit for automatically controlling transmission power of a site according to an embodiment of the present invention.

A preferred embodiment of the present invention will be described in detail hereinbelow with reference to the attached drawings, wherein the like reference numerals represent the like elements.

It should be noted that a term "measurement value of transmission power" used throughout the specification means a current transmission power, and a term "calculated value of transmission value" means a steady-state transmission power (or an ideal value of the transmission power).

Referring to FIG. 1, an embodiment of the present invention is locate at a final output stage 160 of a site transmitter to control intensity of the final output without causing an effect on the whole system performance. Namely, the transmission power outputted from a power amplifier 160, a final stage, is propagated into the air via an antenna 128. Here, a coupler 127 is interposed between the power amplifier 160 and a power measurer 129 for measuring the transmission power precisely, to couple the power amplifier 160 to the power measurer 129. A detector 130 receives the measurement value of the transmission power measured at the power measurer 129, for comparing the measurement value with a value calculated in advance at a steady state so as,to obtain an error power from the measurement and calculated values. The detector 130 is realized by a personal computer including a GP-IB (General Purpose-Interface Bus). A power controller 131 receives the error power output from the detector 130. A variable attenuator 123 is interposed between the power amplifier 160 and a transmitter 140 for amplifying, converting and filtering the signal outputs from a plurality of digital processors (111-1, 111-2 . . . , 111-N). The transmitter 140 includes amplifiers (112, 116), converters (113, 117, 120), filters (115, 119, 122), and local oscillators (114, 118, 121). The variable attenuator 123 attenuates the signal output from the transmitter 140 in response to the error power from the power controller 131, to generate an attenuated signal output to the power amplifier 160. Then, the power amplifier 160 amplifies and generates the attenuated signal. In summary, the final high frequency power is measured by the power measurer 129 and the error power is obtained by the detector 130. Then, the variable attenuator 123 is automatically, precisely controlled by the power controller 131 in association with the error power.

Figure 2:
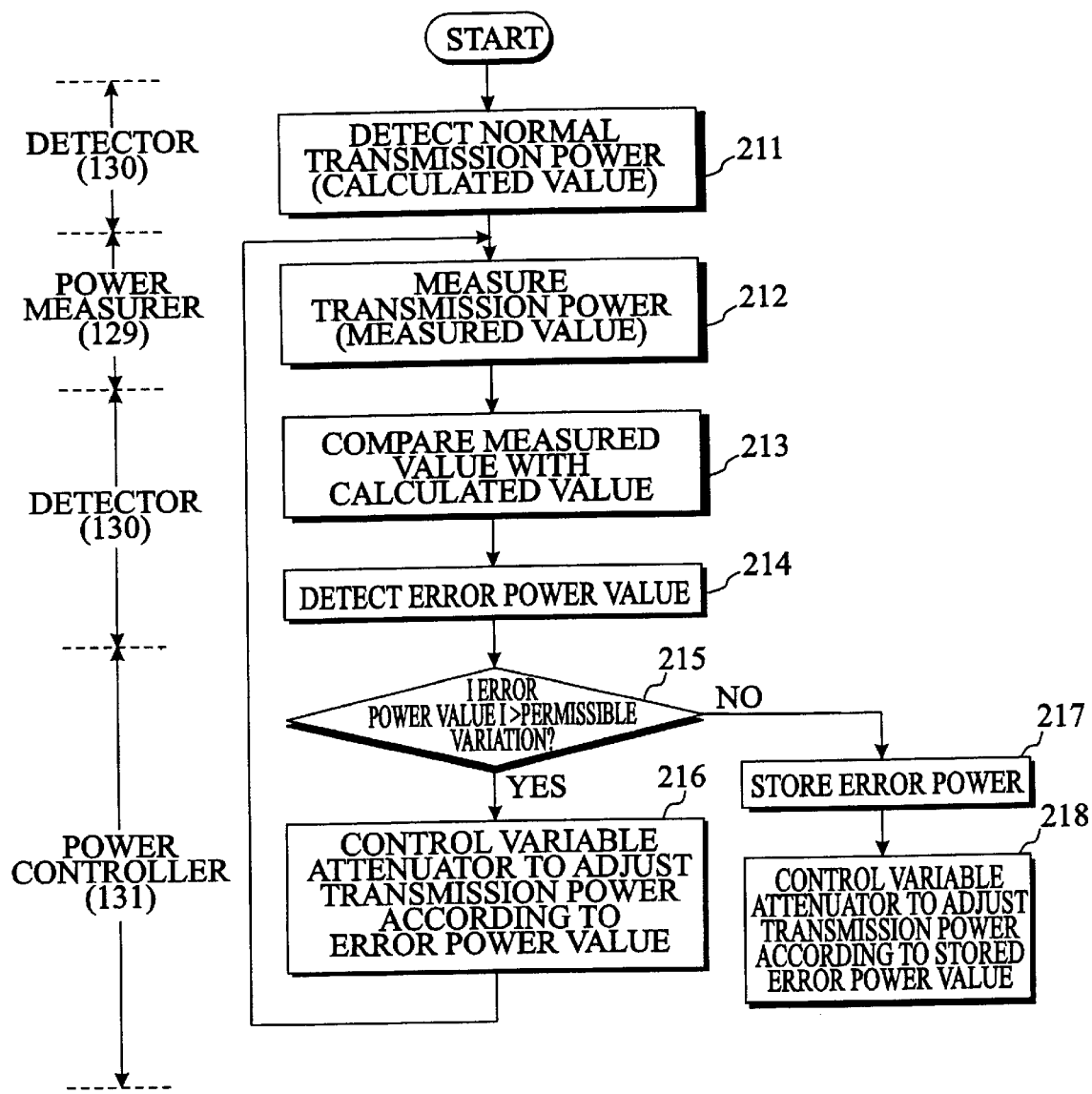
FIG. 2 is a flow chart showing a method for automatically controlling transmission power of a site according to an embodiment of the present invention.

Referring to FIGS. 1 and 2, the transmitter 140 in the CDMA site receives the data output from the digital processors 111-1, 111-2, . . . , 111-N for encoding data processing channels. Then, the transmitter 140 mixes the signals for the respective channels and modulates the mixed signals at 4.95 MHz signal output from a first local oscillator 114, and the modulated signal is converted into the UHF signals for transmission, by using QPSK (Quadrature Phase Shift Keying) modulation. The power amplifier 160 amplifies the UHF signals to transmit. Here, a site control device (not shown) controls the system to transmit the data only on the transmission channel, selectively.

The coupler 127 couples an output signal thereof to the power measurer 129, and the detector 130 detects the intensity of the current transmission power using the GP-IB. Then, the detector 130 compares the detected current transmission power with a calculated transmission value, to obtain the error power value therefrom. Namely, at step 211, the detector 130 obtains the steady-state transmission power (i.e., calculated value). The calculated value of the transmission power is determined, as follows:

$$\text{High Frequency Power Transmission (calculated value)} = \qquad (1)$$
$$\{(\text{digital gain of transmission channel})^2 / 127^2\} \times$$
$$(\text{High Frequency Power per channel when digital gain is 127})$$

At step 212, the power measurer 129 measures the measurement value of the transmission power, and the detector 130 compares the measurement value with the calculated value according to the above equation (1) at step 213, and obtains the error power at step 214. The error power is obtained by subtracting the calculated value from the measurement value. Thereafter, the power controller 131 receives the error power from the detector 130 using a serial port thereof. At step 215, the power controller 131 judges as to whether the absolute error power is higher than a predetermined permissible variation, to go to step 216 if the absolute error power is higher the permissible variation. At step 216, the power controller 131 controls the variable attenuator 123 according to the error power value, to adjust the high frequency power generated from the power amplifier 160.

The steps 212 through 216 are repeated until the high frequency power at the final output stage is within the range of the permissible variation.

In the meantime, if the absolute error power is lower than the permissible variation at the step 215, the power controller 131 stores the error power at step 217, and controls the variable attenuator 123 in association with the stored error power during a normal operation. Therefore, the transmitter may always maintain the precise transmission power. Here, the power measurer 129 and the detector 130 are the devices needed only while setting up the site. Therefore, the power measurer 129 and the detector 130 are used only when setting up a plurality of systems and thereafter may be removed.

As described theretofore, according to the present invention, the high frequency power transmitted from the CDMA transmitter is automatically measured and controlled precisely, thereby improving the communication capability and simplifying the measurement procedure.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A device for automatically controlling transmission power of a site in a mobile communication system, comprising:

at least one digital processor for encoding transmission data of a respective transmission channel;

a transmitter for converting, filtering and amplifying a signal output from said digital processor;

a power amplifier for amplifying a signal output from the transmitter to propagate amplified transmission data of the respective transmission channel via an antenna;

a variable attenuator interposed between said transmitter and said power amplifier, for varying the signal output from said transmitter to be transmitted to said power amplifier;

a power measurer for measuring a current transmission power of said power amplifier;

a detector for comparing a calculated value of the normal transmission power of said power amplifier with a measurement value of the current transmission power of said power amplifier to obtain an error power therefrom;

a power controller for comparing an absolute value of said error power with a permissible variation, to control said variable attenuator in response to the comparison result; and a coupler for coupling said power amplifier to said power measurer.

2. The device of claim 1, wherein said transmitter comprises a variable amplifier, a frequency converter operating in association with a local oscillator, and a filter for converting, filtering and amplifying the signal output from said digital processor.

3. The device of claim 1, wherein said detector comprises a personal computer for calculating said error power based on said calculated value of the normal transmission power.

4. The device of claim 1, wherein said power controller controls said variable attenuator according to the absolute value of the error power when the absolute value of the error power is higher than said permissible variation, and wherein said power controller stores said error power and controls said variable attenuator according to the error power stored when the absolute value of the error power is less than said permissible variation.

5. A method for automatically controlling transmission power of a site in a mobile communication system including a high frequency power transmitter, a power amplifier, a power measurer, a detector, a power controller, and a variable attenuator interposed between said high frequency power transmitter and said power amplifier, comprising the steps of:

calculating a transmission power of said power amplifier at a steady operation state by said detector to generate a calculated value of the steady-state transmission power;

measuring a current transmission power of said power amplifier to generate a measurement value of the transmission power;

detecting an error power by subtracting said calculated value from said measurement value;

comparing an absolute value of said error power with a permissible variation;

controlling said variable attenuator in accordance with said error power when said absolute value of the error power is higher than said permissible variation; and storing said error power when said absolute value of the error power is lower than said permissible variation, and controlling said variable attenuator in accordance with said stored error power.

6. The device of claim 1, wherein said transmitter comprises:

a variable amplifier for amplifying the signal output from said digital processor of a respective channel to produce a variable amplified signal;

a first converter for modulating said variable amplified signal in accordance with a first local oscillation signal to produce a first modulated signal;

a first filter for filtering said first modulated signal to produce a first filtered signal;

a first amplifier for amplifying said first filtered signal to produce a first amplified signal;

a second converter for modulating said first amplified signal in accordance with a second local oscillation signal to produce a second modulated signal;

a second filter for filtering said second modulated signal to produce a second filtered signal;

a third converter for modulating said second filtered signal in accordance with a third local oscillation signal to produce a third modulated signal; and a third filter for filtering said third modulated signal to produce an output signal.

7. The device of claim 1, wherein said calculated value of the normal transmission power represents an ideal value of the normal transmission power and is determined by $(X^2/127^2)$ times $(Y)$, where $X$ represents a digital gain of transmission channel, and $Y$ represents the normal transmission power per channel when the digital gain is 127.

8. The device of claim 7, wherein said detector corresponds to a personal computer for detecting an intensity of the current transmission power to produce said measurement value and comparing said measurement value with said calculated value of the normal transmission power to obtain said error power.

9. The device of claim 8, wherein said mobile communication system propagates said amplified transmission data using a code division multiple access modulation technique.

10. The method of claim 5, wherein said calculated value of the steady-state transmission power represents an ideal value of the transmission power and is determined by $(X^2/127^2)$ times $(Y)$, where $X$ represents a digital gain of transmission channel, and $Y$ represents the transmission power per channel when the digital gain is 127.

11. The method of claim 5, wherein said detector corresponds to a personal computer for detecting an intensity of the current transmission power to produce said measurement value and comparing said measurement value with said calculated value of the transmission power to obtain said error power.

12. The method of claim 5, wherein said mobile communication system propagates amplified transmission data using a code division multiple access modulation technique.

13. A device for automatically controlling transmission power of a transmission site in a mobile communication system, comprising:

at least one digital processor for processing an information signal of a respective channel;

a transmitter for modulating said information signal from said digital processor to produce a transmission signal for transmission via an antenna;

a power amplifier for amplifying said transmission signal for transmission at a desirable transmission power via said antenna;

a variable attenuator disposed between said transmitter and said power amplifier, for attenuating said transmission signal output from said transmitter before amplification by said power amplifier in accordance with an error power value to adjust the transmission power of said transmission signal from said power amplifier before transmission via said antenna;

a power controller for automatically adjusting the transmission power of said transmission signal by providing said error power value to said variable attenuator; and a transmission power setting unit connectable to said power controller and a coupler coupling between said power amplifier and said antenna during the setting of said transmission site, for measuring an intensity of a current transmission power of said power amplifier to produce a measurement value reflecting the intensity of the current transmission power of said power amplifier, and comparing said measurement value with a known value of normal transmission power to produce said error power value.

14. The device of claim 13, wherein said power controller automatically controls the transmission power adjustment, during the setting of said transmission site, by:

determining whether an absolute value of said error power value is within a permissible range;

when the absolute value of said error power value is within said permissible range, storing said error power value in an internal memory, and subsequently providing said error power value stored in said internal memory to said variable attenuator for the transmission power adjustment; and alternatively, when the absolute value of said error power value is not within said permissible range, directly providing said error power value to said variable attenuator for the transmission power adjustment.

15. The device of claim 13, wherein said transmission power setting unit comprises:

a power measurer connected to said coupler for measuring the intensity of the current transmission power from said power amplifier; and a detector connected to said power measurer for comparing said measurement value with said known value of normal transmission power to produce said error power value.

16. The device of claim 13, wherein said transmission power setting unit corresponds to a personal computer connected to said power controller and said coupler, during the setting of said transmission site, for measuring the intensity of the current transmission power from said power amplifier and comparing said measurement value with said known value of normal transmission power to produce said error power value.

17. The device of claim 13, wherein said transmitter comprises:

a variable amplifier for amplifying said information signal output from said digital processor of the respective channel to produce a variable amplified signal;

a first converter for modulating said variable amplified signal in accordance with a first local oscillation signal to produce a first modulated signal;

a first filter for filtering said first modulated signal to produce a first filtered signal;

a first amplifier for amplifying said first filtered signal to produce a first amplified signal;

a second converter for modulating said first amplified signal in accordance with a second local oscillation signal to produce a second modulated signal;

a second filter for filtering said second modulated signal to produce a second filtered signal;

a third converter for modulating said second filtered signal in accordance with a third local oscillation signal to produce a third modulated signal; and a third filter for filtering said third modulated signal to produce said transmission signal.

18. The device of claim 13, wherein said known value of normal transmission power represents an ideal value of the transmission power and is determined by $(X^2/127^2)$ times (Y), where X represents a digital gain of transmission channel, and Y represents the transmission power per channel when the digital gain is 127.

19. The device of claim 18, wherein said mobile communication system propagates said transmission signal via said antenna using a code division multiple access modulation technique.

20. The device of claim 13, wherein said mobile communication system propagates said transmission signal via said antenna using a code division multiple access modulation technique.

* * * * *